United States Patent
Cheng et al.

(10) Patent No.: US 9,343,656 B2
(45) Date of Patent: May 17, 2016

(54) MAGNETIC TUNNEL JUNCTION (MTJ) STRUCTURE IN MAGNETIC RANDOM ACCESS MEMORY

(75) Inventors: Kai-Wen Cheng, Hsin-Chu (TW); Chwen Yu, Taipei (TW); Chih-Ming Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/410,714

(22) Filed: Mar. 2, 2012

(65) Prior Publication Data

US 2013/0228882 A1  Sep. 5, 2013

(51) Int. Cl.
*H01L 29/82* (2006.01)
*H01L 43/08* (2006.01)

(52) U.S. Cl.
CPC ...................... *H01L 43/08* (2013.01)

(58) Field of Classification Search
CPC ...... H01L 43/08; G11C 11/16; G11C 11/161; G11C 11/1659
USPC .......... 257/421–425, 427, E43.004, E29.167, 257/E21.665; 365/94, 97, 103, 158, 365/171–173, 145
See application file for complete search history.

(56) References Cited

U.S. PATENT DOCUMENTS

| 7,009,266 B2 * | 3/2006 | Shi et al. ..................... 257/421 |
| 7,394,626 B2 * | 7/2008 | Fukumoto et al. .......... 360/324.2 |
| 2002/0048128 A1 * | 4/2002 | Kamiguchi et al. ........ 360/324.1 |
| 2003/0007398 A1 * | 1/2003 | Daughton et al. ............ 365/200 |
| 2003/0202375 A1 * | 10/2003 | Sharma et al. ............... 365/158 |
| 2006/0220084 A1 * | 10/2006 | Umehara et al. .............. 257/296 |
| 2008/0186759 A1 * | 8/2008 | Shimizu et al. ............... 365/158 |
| 2008/0241597 A1 * | 10/2008 | Dieny et al. ................. 428/811.2 |

FOREIGN PATENT DOCUMENTS

| CN | 1455463 | 11/2003 |
| CN | 101300735 | 11/2008 |

OTHER PUBLICATIONS

Bass, Jack, and William P. Pratt Jr. "Spin-diffusion lengths in metals and alloys, and spin-flipping at metal/metal interfaces: an experimentalist's critical review." Journal of Physics: Condensed Matter 19.18 (2007): 183201.*

In re Rose, 220 F.2d 459, 105 USPQ 237 (CCPA 1955).*

(Continued)

*Primary Examiner* — Fernando L Toledo
*Assistant Examiner* — Christine C Lau
(74) *Attorney, Agent, or Firm* — Slater Matsil, LLP

(57) ABSTRACT

Methods and apparatuses for a magnetic tunnel junction (MTJ) which can be used in as a magnetic random access memory cell are disclosed. The MTJ comprises a free layer and an insulator layer. The MTJ further comprises a pinned layer with a first region, a second region, and a third region. The second region is of a first length and of a first thickness, and the first region and the third region are of a second length and of a second thickness. A ratio of the first thickness to the second thickness may be larger than 1.2. A ratio of the second length to the first length is larger than 0.5. The first thickness may be larger than a spin diffusion length of a material for the pinned layer. So formed MTJ results in increased tunneling magnetic resistance ratio and reduced critical switch current of the MTJ.

17 Claims, 2 Drawing Sheets

(56) References Cited

OTHER PUBLICATIONS

Cheng, K. W., et al., "Compensation Between Magnetoresistance and Switching Current in Co/Cu/Co Spin Valve Pillar Structure," Applied Physics Letters 96, 093110, Mar. 4, 2010, 3 pages.

Grollier, J., et al., "Spin-polarized Current Induced Switching in Co/Cu/Co Pillars," Applied Physics Letters, Jun. 4, 2001, vol. 78, No. 23, 3 pages.

Kurt, H., et al., "Effect of Asymmetric Leads on Critical Switching Current in Magnetic Nanopillars," Applied Physics Letters 89, 082513, Aug. 24, 2006, 3 pages.

* cited by examiner

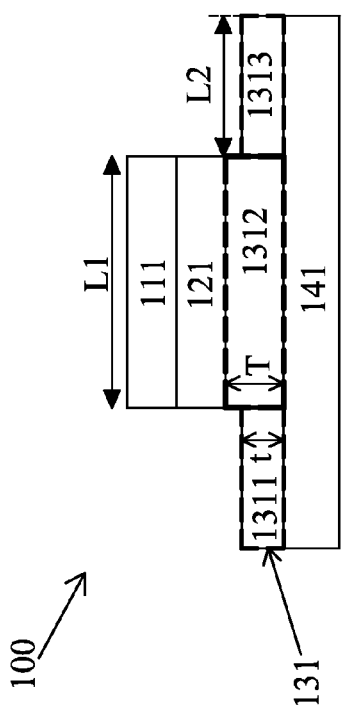 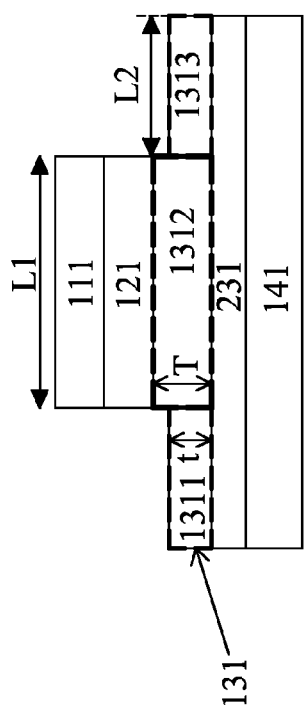
Fig. 1(a)
Fig. 1(b)

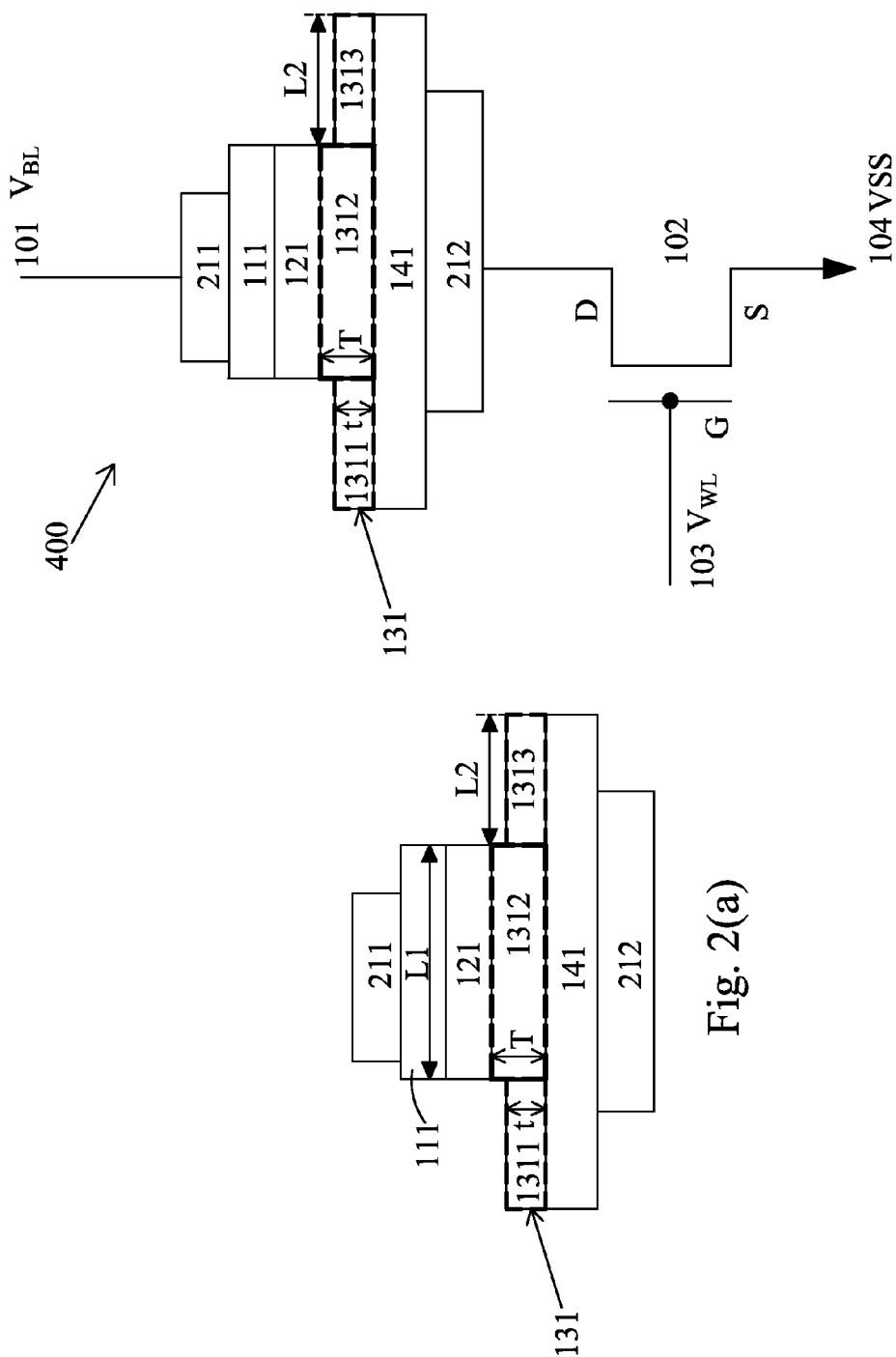

MAGNETIC TUNNEL JUNCTION (MTJ) STRUCTURE IN MAGNETIC RANDOM ACCESS MEMORY

BACKGROUND

Some semiconductor devices comprise memory devices that are used to store information. A recent development in semiconductor memory devices is magnetic random access memory (MRAM) devices. MRAM devices comprise conductive lines (word-lines and bit-lines) positioned in different directions, e.g., perpendicular to one another in different metal layers. The conductive lines sandwich resistive MRAM cells that comprise magnetic tunnel junctions (MTJs), which function as magnetic memory cells. An MRAM cell is a form of non-volatile memory capable of storing bits of digital information (binary 0's or 1's). MRAM digital data is not stored as an electrical charge as in traditional RAM components, rather the bit state (being 0 or 1) is stored via resistive states (high resistance or low resistance) or magnetic states in magnetic storage elements such as MTJs which do not require constant electrical power to retain their state.

In a read operation of a MRAM cell, the information is read by sensing the magnetic state (resistance level) of the MTJ through a sensing current flowing through the MTJ. For a write operation of a MRAM cell, the information is written with change of the magnetic state to a predefined one by applying current to the MTJ to switch the magnetization of the MTJs. For an MTJ to change states, the current through the MTJ must be greater than a critical switching current of the MTJ and a higher switching current is required for faster switching. For an MTJ with a lower critical switching current, a lower switching current can be used for the write operation of the MTJ so the power consumption is reduced. Therefore methods of reducing critical switch current of an MTJ are of interests.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1(a)-1(b) illustrate a cross-sectional view of a MTJ; and

FIGS. 2(a)-2(b) illustrate a MRAM cell comprising a MTJ and two electrodes.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the embodiments of the present disclosure provide many applicable concepts that can be embodied in a wide variety of specific contexts. The specific embodiments discussed are merely illustrative of specific ways to make and use the disclosure, and do not limit the scope of the disclosure.

As will be illustrated in the following, a magnetic tunnel junction (MTJ) functioning as a magnetic random access memory (MRAM) cell is disclosed. The MTJ comprises a pinned layer with a number of regions that have different thickness, which results in increased tunneling magnetic resistance (TMR) ratio and reduced critical switch current of the MTJ.

FIG. 1(a) illustrates an exemplary cross-section of the MTJ 100 which may be employed as a MRAM cell. The MTJ 100 comprises a free layer 111, an insulator layer 121 next to the free layer 111, and a pinned layer 131. The pinned layer 131 comprises a first region 1311, a second region 1312, and a third region 1313, wherein the second region 1312 is next to the insulator layer 121 and adjacent to the first region 1311 and the third region 1313. The free layer 111, the insulator 121, and the second region 1312 are substantially of a same first length L1. The first region 1311 and the third region 1313 are of a second length L2. The second region 1312 is of a first thickness T, while the first region 1311 and the third region 1313 are of a second thickness t. The length of the pinned layer 131 is the sum of the lengths of the first region 1311, the second region 1312, and the third region 1313. The layer 141 is an anti-ferromagnetic material (AFM) layer next to the pinned layer 131 and of substantially the same length of the pinned layer 131.

The layers in the MTJ 100 such as 111, 121, 131, and 141, may be formed by sputtering or ion beam deposition, physical vapor deposition, or chemical vapor deposition. Generally, these layers may be patterned using photolithography techniques by forming a patterned mask to protect the desired portions of the AFM layer 141, the pinned layer 131, the insulator layer 121, and the free layer 111. Exposed portions may then be removed using one or more acceptable techniques, such as using an anisotropic etch. In other embodiments, one or more of the layers could be deposited in a patterned fashion using molecular beam epitaxy, ion beam epitaxy, or the like.

For the embodiment of the MTJ 100 illustrated in FIG. 1(a), the length and thickness are not drawn to scale. Instead they are only for illustration purposes and are not limiting. Example length for the first length L1 of the free layer 111 may be between 1.0 nanometer (nm) and 1.0 micrometer (μm). Other lengths for the free layer 111 are possible too. A ratio of the first thickness T to the second thickness t may be about larger than 1.2. Similarly, a ratio of the second length L2 to the first length L1 may be about larger than 0.5, which can simplify the MTJs deposited process. Embodiments of MTJs so formed may have the proper pinned layer thickness and length to increase tunneling magnetic resistance (TMR) ratio to reduce critical switch current.

As illustrated in FIG. 1(a), the two ferromagnetic layers 111 and 131 of the MTJ 100 are separated by a thin insulator layer 121 which may act as a tunneling barrier layer. The fixed or pinned layer 131 is a ferromagnetic layer whose magnetic orientation may not be changed during operation of its associated MRAM cell. The free layer 111 is also a ferromagnetic layer whose magnetic polarity or magnetic orientation can be changed during write operation of its associated MRAM cell. The relative alignment of the magnetic fields of the pinned layer 131 and free layer 111 determines the resistive state (high resistance or low resistance) of the insulator layer 121 interposed between the pinned layer 131 and free layer 111. Digital information stored in an MTJ 100 is read by detecting the MTJ's resistive state.

When the magnetic orientations of the free layer 111 and pinned layer 131 are anti-parallel (AP) to each other, a first memory state exists (e.g., a logical '1'). When the magnetic orientations of the free layer 111 and pinned layer 131 are parallel (P) to each other, a second memory state exists (e.g., a logical '0'). The magnetic orientation of the free layer 111 and pinned layer 131 can be sensed to read data stored in the MTJ by sensing the resistance when current flows through the MTJ. To change the state of the MTJ, the magnetic polarity of the free layer is altered by applying current to the free layer to switch the magnetization of the free layer.

As illustrated in FIG. 1(a), the AFM layer 141 is coupled to the pinned layer 131. The AFM layer 141 is of substantially the same length as the pinned layer 131 or has a third length larger than the length of the second region of the pinned layer. The AFM layer 141 is implemented to hold or "pin" the magnetic orientation of the pinned layer 131 in a fixed direction. The AFM layer 141 may be formed of suitable thickness, which may be between approximately 10 and 10000 Angstroms as an example. The AFM layer 141 may be formed from any suitable anti-ferromagnetic material desired. Examples include Platinum-Manganese (PtMn), and Iridium-Manganese (IrMn).

The insulator layer 121 may be formed by a thin dielectric material placed or deposited on the pinned layer 131. The insulator layer 121 may be formed of suitable thickness, which may be between approximately 1 and 40 Angstroms as an example. The insulator layer 121 may be formed from any suitable dielectric material desired. Examples include Magnesium Oxide (MgO), Aluminum Oxides (AlOx or $Al_2O_3$), or Titanium Oxides (TiOx or $TiO_2$).

The free layer 111 has a magnetic orientation that is either P or AP to the magnetic orientation of the pinned layer 131. The free layer 111 may be formed of suitable thickness, which may be between approximately 1 nm and 1 μm as an example. The free layer 111 may be formed from any suitable ferromagnetic material desired. Examples include Cobalt-Iron-Boron (CoFeB), CoFe, and Nickel-Iron (NiFe), Co, Fe, Ni, FeB, or FePt. The free layer 111 may also comprise composite ferromagnetic layers.

The pinned layer 131 may be formed from any suitable ferromagnetic material or alloys that include iron, CoFe, CoFeB, or composite layers like CoFeB/Ru/CoFeB/PtMn. The pinned layer 131 may comprise a single pinned ferromagnetic layer as shown in FIG. 1(a). The pinned layer may comprise a multiple sub-layers of different elements of compositions. Such an embodiment with multiple sub-layers is shown in FIG. 1(b), where both the layers 131 and 231 are pinned layers stacked together between the AFM layer 141 and the insulator layer 121.

The second region 1312 of the pinned layer 131, which is adjacent to the insulator layer 121 and of the first length, may be of the first thickness that is larger than a spin diffusion length (SDL) of a material for the pinned layer. In order to maximize spin polarization of injection current, the thickness of a pinned layer must be larger than the SDL of CoFeB when the pinned layer 131 comprises CoFeB material. Other examples may include, the first thickness is in a range from about 1.0 to about 1.2 times SDL of the material for the pinned layer. Similarly, the first region 1311 and the third region 1313 of the pinned layer 131 are of the second thickness which may be in a range from about 0.8 to about 1.0 times SDL of the material for the pinned layer.

A pinned layer 131 surface may not be limited to any particular geometry or physical design. As another example, if the structures of the cross-sections of the pinned layer and/or the free layer are circular or elliptical, these dimensions can include diameter or radius, circumference, or both. If the structures of the cross-sections of the pinned layer and/or free layer are polygons, the dimensions can include length of sides, angle between sides, height, and/or width, or any combination of the same.

Illustrated in FIG. 2(a), a first electrode 211 and a second electrode 212 may be formed. The first electrode 211 is adjacent to the free layer 111, while the second electrode 212 is adjacent to the AFM layer 141. The electrodes 211 and 212 may be formed in a dielectric layer by any suitable process, including a damascene process. Other processes, such as deposition and etching, dual damascene, and the like, may also be used. The first electrode 211 and the second electrode 212 may be formed of any suitable conductive material, such as a highly-conductive, low-resistive metal, elemental metal, transition metal, or the like, including metals or metal alloys including one or more of Al, AlCu, Cu, Ti, TiN, W, and the like, or doped poly. Furthermore, the first electrode 211 and the second electrode 212 may include a barrier/adhesion layer to prevent diffusion and provide better adhesion between the first electrode 211 and the second electrode 212 and the surrounding dielectric layers. The first electrode 211 and the second electrode 212 may be formed, for example, by physical vapor deposition (PVD), atomic layer deposition (ALD), spin-on deposition, or other suitable methods.

As illustrated in FIG. 2(a), the location and shape of the first electrode 211 and the second electrode 212 are provided for illustrative purposes only and are not limiting. Furthermore, the first electrode 211 and the second electrode 212 may include a conductive line and/or redistribution line to extend first electrode 211 and the second electrode 212 laterally past the overlying memory structure.

FIG. 2(b) illustrates an exemplary MRAM cell 400 containing an exemplary MTJ as illustrated in FIG. 2(a). The AFM layer 141 is coupled to the second electrode 212 while the free layer 111 is coupled to the first electrode 211. The drain (D) of an access control transistor 102 is coupled to the second electrode 212. The MRAM cell 400 may be provided in a memory array and used as memory storage for any type of system requiring electronic memory, such as a computer processing unit (CPU) or processor-based system, as examples.

A metal-oxide semiconductor (typically n-type MOS, i.e., NMOS) access transistor 102 may be provided to control reading and writing to the MTJ. A bit line 101 (VBL) is coupled to the first electrode 211. The drain (D) of the access transistor 102 is coupled to the second electrode 212. A write line 103 ($V_{WL}$) is coupled to the gate (G) of the access transistor 102. The source (S) of the access transistor 102 is coupled to a voltage source ($V_{SS}$) 104.

When reading data stored in the MTJ, the bit line ($V_{BL}$) 101 is activated for the access transistor 102 to allow current to flow through the MTJ between the electrodes 211 and 212. A low resistance, as measured by voltage applied on the bit line ($V_{BL}$) 101 divided by the measured current, is associated with a parallel (P) orientation between the free layer 111 and pinned layer 131. A higher resistance is associated with an anti-parallel (AP) orientation between the free layer 111 and pinned layer 131. When writing data to the MTJ, the gate (G) of the access transistor 102 is activated by activating the write line ($V_{WL}$) 103. A voltage differential between the bit line ($V_{BL}$) 101 and the source line ($V_{SS}$) 104 is applied. As a result, a write current (I) is generated between the drain (D) and the source (S). If the magnetic orientation is to be changed from AP to P, a write current ($I_{AP-P}$) flowing from the first electrode 211 to the second electrode 212 is generated, which change the magnetic orientation of the free layer 111 to be in parallel (P) with respect to the pinned layer 131. If the magnetic orientation is to be changed from P to AP, a current ($I_{P-AP}$) flowing from the second electrode 212 to the first electrode 211 is produced, which change the magnetic orientation of the free layer 111 to be anti-parallel (AP) with respect to the pinned layer 131.

Various modifications may be made to the above MTJ structures. The MTJ structure may be provided in any orientation or axis, including vertical (as illustrated), horizontal, or angled. Further, the cross-section of the MTJ layers may be provided of any shape desired, including rectangular, other polygon, or elliptical. The MTJ layers, including the pinned layer and the free layer may be of different shapes or structures. Depending on the composition of the various layers and etches used, the order in which certain layers are placed or deposited can be varied. It will also be recognized that the order of layers and the materials forming those layers in the above embodiments are merely exemplary. Moreover, in some embodiments, other layers (not shown) may be placed or deposited and processed to form portions of a MTJ device or to form other structures on the substrate. In other embodiments, these layers may be formed using alternative deposition, patterning, and etching materials and processes, may be placed or deposited in a different order, or composed of different materials, as would be known to one of skill in the art.

Further, the MTJ may be provided in any electronic device for storing data. The MTJ device may be provided in MRAM circuit to store data, where such data can be stored, read from, and/or written into the MTJ. The MTJ according to embodiments disclosed herein may be included or integrated in a semiconductor die and/or in any other device, including an electronic device. Examples of such devices include, without limitation, a set top box, an entertainment unit, a navigation device, a communications device, a personal digital assistant (PDA), a fixed location data unit, a mobile location data unit, a mobile phone, a cellular phone, a computer, a portable computer, a desktop computer, a monitor, a computer monitor, a television, a tuner, a radio, a satellite radio, a music player, a digital music player, a portable music player, a video player, a digital video player, a digital video disc (DVD) player, and a portable digital video player.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. Those of ordinary skill in the art would also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Overall, the description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A structure for a magnetic random access memory cell comprising:
   a free layer of a first length;
   an insulator layer next to the free layer;
   a pinned layer comprising a first region, a second region, and a third region, wherein the second region is next to the insulator layer and adjacent to the first region and the third region, the second region is of the first length and of a first thickness, and the first region and the third region are of a second length and of a second thickness smaller than the first thickness, wherein:
      a ratio of the second length to the first length is larger than 0.5;
      the first thickness is greater than a spin diffusion length (SDL) of a material forming the pinned layer and less than or equal to 1.2 times the SDL; and
      the second thickness is greater than or equal to 0.8 times the SDL and less than the SDL;
   an anti-ferromagnetic material (AFM) layer located next to the pinned layer, the AFM layer having a third length larger than the first length; and
   a first electrode connected to the free layer and a second electrode in physical contact with the AFM layer, wherein a lateral extent of the second electrode is smaller than a lateral extent of the AFM layer but greater than a lateral extent of the free layer, and wherein a lateral extent of the first electrode is smaller than the lateral extent of the free layer.

2. The structure of claim 1, wherein a ratio of the first thickness to the second thickness is about larger than 1.2.

3. The structure of claim 1, wherein the free layer comprises CoFeB, NiFe, Co, Fe, Ni, FeB, or FePt.

4. The structure of claim 1, wherein the pinned layer comprises CoFe, CoFeB, or CoFeB/Ru/CoFeB/PtMn.

5. The structure of claim 1, wherein the insulator layer comprises MgO or Al2O3.

6. The structure of claim 1, wherein the pinned layer is of a circular, an elliptical, or a polygon shape.

7. The structure of claim 1, wherein the AFM layer is formed from Platinum-Manganese (PtMn), Iridium-Manganese (IrMn), or other anti-ferromagnetic material.

8. The structure of claim 1, wherein the AFM layer is at a thickness between approximately 10 and 10000 Angstroms.

9. The structure of claim 1, wherein the first electrode is electrically connected to a bit line, and wherein the second electrode is electrically connected to a transistor.

10. The structure of claim 9, wherein the second electrode is electrically connected to a drain terminal of the transistor.

11. A method of forming a magnetic tunnel junction (MTJ), comprising:
    forming a first pinned layer;
    forming a second pinned layer over the first pinned layer, the first pinned layer and the second pinned layer physically contacting each other and differing in composition, the second pinned layer comprising a first region, a second region, and a third region, wherein the second region adjacent to the first region and the third region is of a first length and a first thickness, and the first region and the third region are of a second length and of a second thickness smaller than the first thickness, wherein:
       the first thickness is greater than a spin diffusion length (SDL) of a material forming the second pinned layer and less than or equal to 1.2 times the SDL; and
       the second thickness is greater than or equal to 0.8 times the SDL and less than the SDL;

forming an insulator layer of the first length on top of and physically contacting the second region of the second pinned layer;

forming a free layer of the first length on top of the insulator layer, wherein a ratio of the second length to the first length is larger than 0.5;

forming an anti-ferromagnetic material (AFM) layer over a surface of the first pinned layer facing away from the insulator layer, the AFM layer physically contacting the first pinned layer and having a third length larger than the first length; and forming a first electrode and a second electrode over the free layer and the AFM layer, respectively, wherein a lateral extent of the second electrode is smaller than a lateral extent of the AFM layer, and wherein a lateral extent of the first electrode is smaller than a lateral extent of the free layer.

12. The method of claim 11, wherein a ratio of the first thickness to the second thickness is larger than 1.2.

13. The method of claim 11, wherein the free layer comprises CoFeB, NiFe, Co, Fe, Ni, FeB, or FePt.

14. The method of claim 11, wherein the second pinned layer comprises CoFe, CoFeB, or CoFeB/Ru/CoFeB/PtMn.

15. The method of claim 11, wherein the insulator layer comprises MgO or Al2O3.

16. The method of claim 11, wherein the second pinned layer is of a circular, an elliptical, or a polygon shape.

17. A method of forming a magnetic tunnel junction (MTJ), comprising:

forming a first pinned layer;

forming a second pinned layer over the first pinned layer, the second pinned layer and the first pinned layer physically contacting each other and differing in composition, the second pinned layer comprising a first region, a second region, and a third region, wherein the second region adjacent to the first region and the third region is of a first length and a first thickness, and the first region and the third region are of a second length and of a second thickness smaller than the first thickness, wherein:

the first thickness is greater than a spin diffusion length (SDL) of a material forming the second pinned layer and less than or equal to 1.2 times the SDL; and the second thickness is greater than or equal to 0.8 times the SDL and less than the SDL;

forming an insulator layer of the first length on top of the second region of the second pinned layer;

forming a free layer of the first length on top of the insulator layer, wherein a ratio of the second length to the first length is larger than 0.5;

forming an anti-ferromagnetic material (AFM) layer over a surface of the first pinned layer facing away from the insulator layer, the AFM layer having a third length larger than the first length; and forming a first electrode and a second electrode in physical contact with the free layer and the AFM layer, respectively, wherein a width of the second electrode is smaller than the third length but greater than the first length, and wherein a width of the first electrode is smaller than the first length.

* * * * *